US008698554B2

(12) United States Patent
Krebs (10) Patent No.: US 8,698,554 B2
(45) Date of Patent: Apr. 15, 2014

(54) SECOND ORDER ACTIVE HIGH-PASS FILTER WITH CROSS-COUPLED FEEDBACK FOR Q ENHANCEMENT

(75) Inventor: Andrew P. Krebs, Eagan, MN (US)

(73) Assignee: LSI Corporation, San Jose, CA (US)

(*) Notice: Subject to any disclaimer, the term of this patent is extended or adjusted under 35 U.S.C. 154(b) by 44 days.

(21) Appl. No.: 13/326,557

(22) Filed: Dec. 15, 2011

(65) Prior Publication Data
US 2013/0154726 A1 Jun. 20, 2013

(51) Int. Cl.
*H03H 11/12* (2006.01)
*H04B 1/10* (2006.01)

(52) U.S. Cl.
USPC .......................................... 327/559; 333/176

(58) Field of Classification Search
USPC ........................................................ 327/559
See application file for complete search history.

(56) References Cited

U.S. PATENT DOCUMENTS

| 5,317,216 | A  | * | 5/1994  | Hosoya et al.   | 327/555 |
|-----------|----|---|---------|-----------------|---------|
| 5,506,542 | A  | * | 4/1996  | Hamano et al.   | 327/558 |
| 5,708,389 | A  | * | 1/1998  | Gabara          | 327/552 |
| 6,133,784 | A  | * | 10/2000 | Gregoire        | 327/559 |
| 6,476,676 | B1 | * | 11/2002 | Tanaka et al.   | 330/258 |
| 6,744,306 | B2 | * | 6/2004  | Yonezawa        | 327/552 |
| 6,980,055 | B2 |   | 12/2005 | Gharpurey       | 330/257 |
| 7,639,069 | B2 |   | 12/2009 | Li et al.       | 327/551 |
| 7,777,593 | B2 |   | 8/2010  | Weitzenberger   | 333/134 |
| 7,817,757 | B2 |   | 10/2010 | Hidaka          | 375/350 |
| 7,843,287 | B2 |   | 11/2010 | Masuda et al.   | 333/215 |
| 8,274,326 | B2 | * | 9/2012  | Boecker         | 327/559 |
| 2011/0140785 | A1 |   | 6/2011 | Lian et al.     | 330/293 |

* cited by examiner

*Primary Examiner* — Lincoln Donovan
*Assistant Examiner* — Terry L Englund
(74) *Attorney, Agent, or Firm* — Christopher P. Maiorana, PC (57) ABSTRACT

An apparatus comprising an input circuit, a cross coupled active circuit and an output circuit. The input circuit may be configured to generate a first portion of an intermediate signal in response to an input signal. The cross coupled active circuit may be configured to generate a second portion of the intermediate signal in response to a feedback of an output signal. The output circuit may be configured to generate the output signal in response to the intermediate signal. The output signal may pass frequencies above a target frequency.

16 Claims, 8 Drawing Sheets

SECOND ORDER ACTIVE HIGH-PASS FILTER WITH CROSS-COUPLED FEEDBACK FOR Q ENHANCEMENT

FIELD OF THE INVENTION

The present invention relates to filters generally and, more particularly, to a method and/or apparatus for implementing a second order active high-pass filter with cross-coupled feedback for Q enhancement.

BACKGROUND OF THE INVENTION

Many conventional circuits need a high order (greater than one) high-pass filter with a sharp band pass characteristic. Conventional approaches for implementing high-pass filters tend to use a passive approach or an active approach. Conventional active approaches use a number of transistors (i.e., 4 or more active transistors for a differential implementation, 2 or more transistors for a single ended implementation) to implement a second order filter. By implementing a number of active transistors, the overall die area of such an implementation is often substantial. For certain designs, such as preamplifiers in drive systems, integrated circuit real estate needs to be kept to a minimum.

It would be desirable to implement a second order high-pass filter with cross-coupled feedback for implementing Q enhancement.

SUMMARY OF THE INVENTION

The present invention concerns an apparatus comprising an input circuit, a cross coupled active circuit and an output circuit. The input circuit may be configured to generate a first portion of an intermediate signal in response to an input signal. The cross coupled active circuit may be configured to generate a second portion of the intermediate signal in response to a feedback of an output signal. The output circuit may be configured to generate the output signal in response to the intermediate signal. The output signal may pass frequencies above a target frequency.

The objects, features and advantages of the present invention include providing a filter that may (i) provide second order high pass filter, (ii) provide cross coupled feedback, (iii) provide Q enhancement, (iv) filter out random offsets and/or (v) be implemented using a small amount of chip area.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Specifications for the certain electronic designs, such as a hard disc drive (HDD) preamplifier circuit, include the need for a higher order (e.g., >1) high-pass filter. Sharp passband characteristics (e.g., Q greater than 0.5) are also desirable for certain designs. Higher order filters tend to use more chip area. It would be desirable to implement such a filter while minimizing silicon area.

Figure 1:
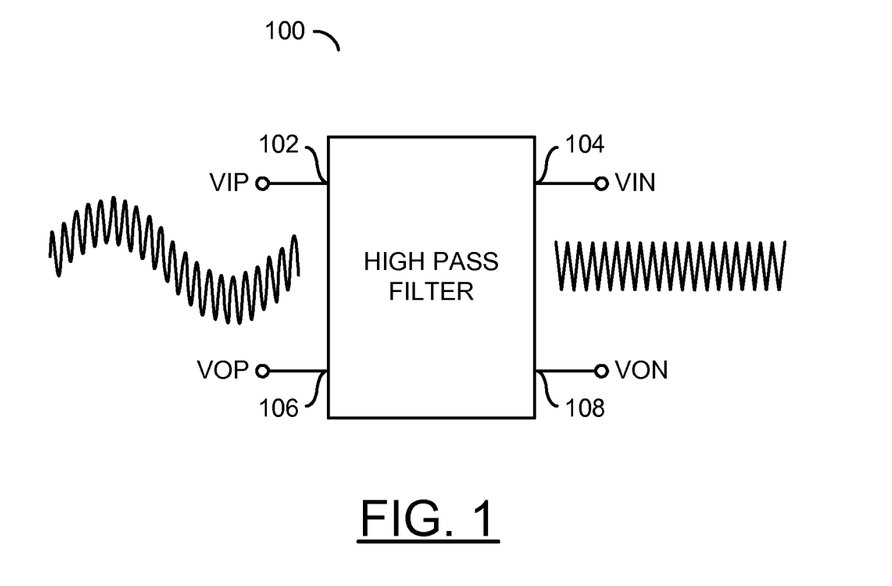
FIG. 1 is a block diagram of the present invention.

Referring to FIG. 1, a diagram of a circuit 100 shown in accordance with an embodiment of the invention. The circuit 100 may be implemented, in one example, as a second order high-pass filter. In one example, the circuit 100 may include cross-coupled feedback. In another example, the circuit 100 may provide Q enhancement (e.g., the transition to a roll-off portion of an output). The circuit 100 may have an input 102 that may receive a signal (e.g., VIP), an input 104 that may receive a signal (e.g., VIN), an output 106 that may present a signal (e.g., VOP), and an output 108 that may present a signal (e.g., VON). The signal VIP and the signal VIN may form a differential input signal. The signal VOP and the signal VON may form a differential output signal. The signal VIP and the signal VOP may be positive portions of a differential signal path. The signal VIN and the signal VON may be negative portions of a differential signal path. The circuit 100 may be configured to pass frequencies above a target frequency. The target frequency may be adjusted (to be described in connection with FIG. 2).

Figure 2:
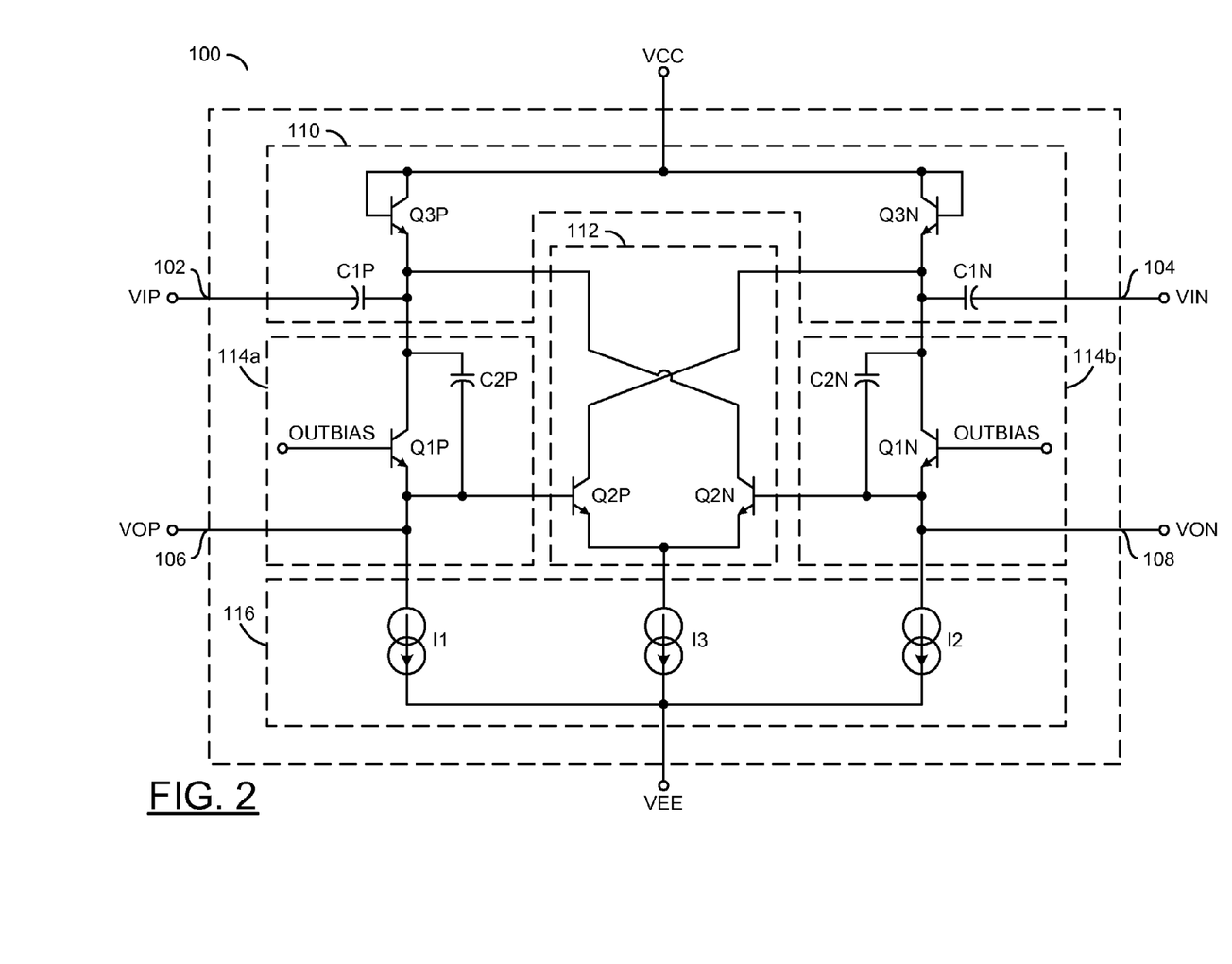
FIG. 2 is a circuit diagram of the present invention.

Referring to FIG. 2, a circuit diagram of the circuit 100 is shown. The circuit 100 generally comprises a block (or circuit) 110, a block (or circuit) 112, a block (or circuit) 114a, a block (or circuit) 114b, and a block (or circuit) 116. The circuit 110 may be implemented as an input bias circuit. The circuit 112 may be implemented as a cross-coupled active circuit. The circuits 114a and 114b may be implemented as portions (or stages) of an output circuit. The circuit 116 may be implemented as an adjustment circuit.

The circuit 110 generally comprises a capacitor (e.g., C1P), a capacitor (e.g., C1N), a transistor (e.g., Q3P), and a transistor (e.g., Q3N). The circuit 112 generally comprises a transistor (e.g., Q2P) and a transistor (e.g., Q2N). The circuit 114a generally comprises a transistor (e.g., Q1P) and a capacitor (e.g., C2P). The circuit 114b generally comprises a transistor (e.g., Q1N) and a capacitor (e.g., C2N). The transistor Q1P may receive a signal (e.g., OUTBIAS). The transistor Q1N may also receive the signal OUTBIAS. The circuit 116 may be implemented as a current source (e.g., I1), a current source (e.g., I2) and a current source (e.g., I3). The transistors in the circuit 110, the circuit 112 and/or the circuits 114a-b may be implemented, in one example, as NPN bi-polar transistors. However, the particular type of transistors implemented may be varied to meet the design criteria of a particular implementation. For example, PNP bi-polar transistors may be used to implement the circuit 110, the circuit 112 and/or the circuits 114a-b. In another example (to be described in more detail in connection with FIG. 6), the circuits 110, 112 and/or 114a-b may be implemented using MOSFET devices.

A target frequency (or resonant frequency) may be set (or adjusted) by appropriate choice of the values Gm of each of the transistors Q1P, Q2P, Q3P, Q1N, Q2N, and/or Q3N and/or the value of C for each of the capacitors C1P, C2P, C1N, and/or C2N. In one example, the values Gm and C may be implemented as fixed values. In another example, the values Gm and C may be trimmed (or tuned) post-production. The particular type of adjustments provided may be varied to meet the design criteria of a particular implementation. In one example, the signal OUTBIAS may be a constant (e.g., DC) voltage that may set the output common mode of the circuit 100. The signal OUTBIAS generally has no effect on the filter performance of the circuit 100. The signal OUTBIAS may be generated internally or externally to the circuit 100.

In one example, the transistor Q3P may be configured as a diode. In another example, the transistor Q3P may be configured as a resistor. Similarly, the transistor Q3N may be configured as a resistor or as a diode. In one example, the signal OUTBIAS presented to the transistor Q1P and/or the transistor Q1N may be the same value. However, the signal OUTBIAS presented to the base of the transistor Q1P, in certain implementations, may be slightly varied from the signal OUTBIAS presented to the base of the transistor Q1N. In such an example, a DC offset between the output signals VOP and VON may be implemented.

The circuit 100 may be used to implement a low area multiple pole filter. In one example, each pole may provide approximately a 20 dB/decade of roll-off. For example, one pole may provide a slope that drops off by about 20 dB for a 10× decrease in frequency (to be illustrated in more detail in connection with FIG. 5). An ideal roll-off may be 20 dB/dec per pole. In a production design, the roll-off may be slightly under 20 dB/dec per pole. The circuit 100 may have a sharp passband when compared with a conventional passive filter and/or an active filter without Q-enhancement. The circuit 100 may implement cross-coupled feedback from the filter output to a "middle node" of the circuit 114. The feedback may provide Q-enhancement (peaking) that may make the overall transfer function sharper. The Q-enhancement may be achieved by implementing the active devices Q2P and/or Q2N. In general, the circuit 100 may implement a 2nd-order differential active filter with the two active devices Q2P and Q2N. The signals processed in the circuit 100 may reject low frequency content and/or remove remnant offsets due to process mismatch and/or sensor biasing.

Figure 3:
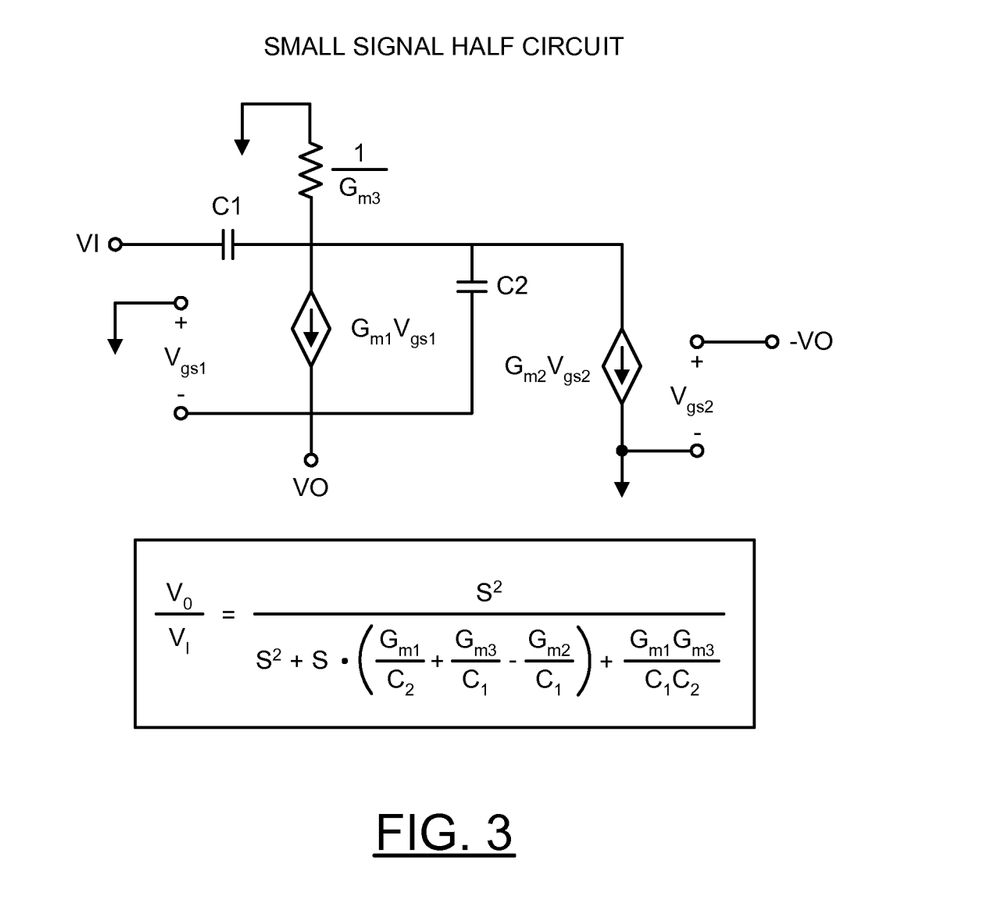
FIG. 3 is a small signal half circuit.

Referring to FIG. 3, a diagram of a small signal half circuit of the circuit 100 is shown. FIG. 3 illustrates the effect that each of the devices (e.g., C1, C2, etc.) may have on the signals within the circuit 100 at a given particular bias point.

Figure 4:
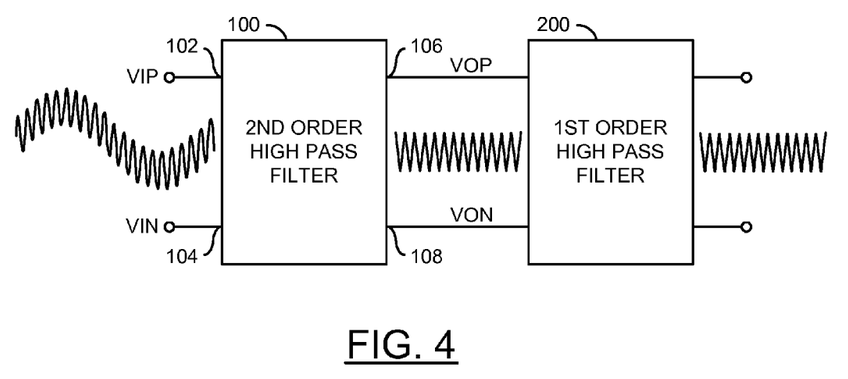
FIG. 4 is a block diagram illustrating two cascaded filters.

Referring to FIG. 4, an example of the circuit 100 is shown used along with another high-pass filter 200. The circuit 200 may be implemented as a first order high pass filter. Such an implementation may be used to create a targeted signal path. For example, the circuit 100 may provide a $2^{nd}$ order (e.g., 2-pole) filter. Such a second order stage normally has two poles and drops off about 40 dB/decade. The combined response of the circuit 100 and the circuit 200 would have 3 poles, with a corresponding drop-off of about 60 dB/dec.

Figure 5:
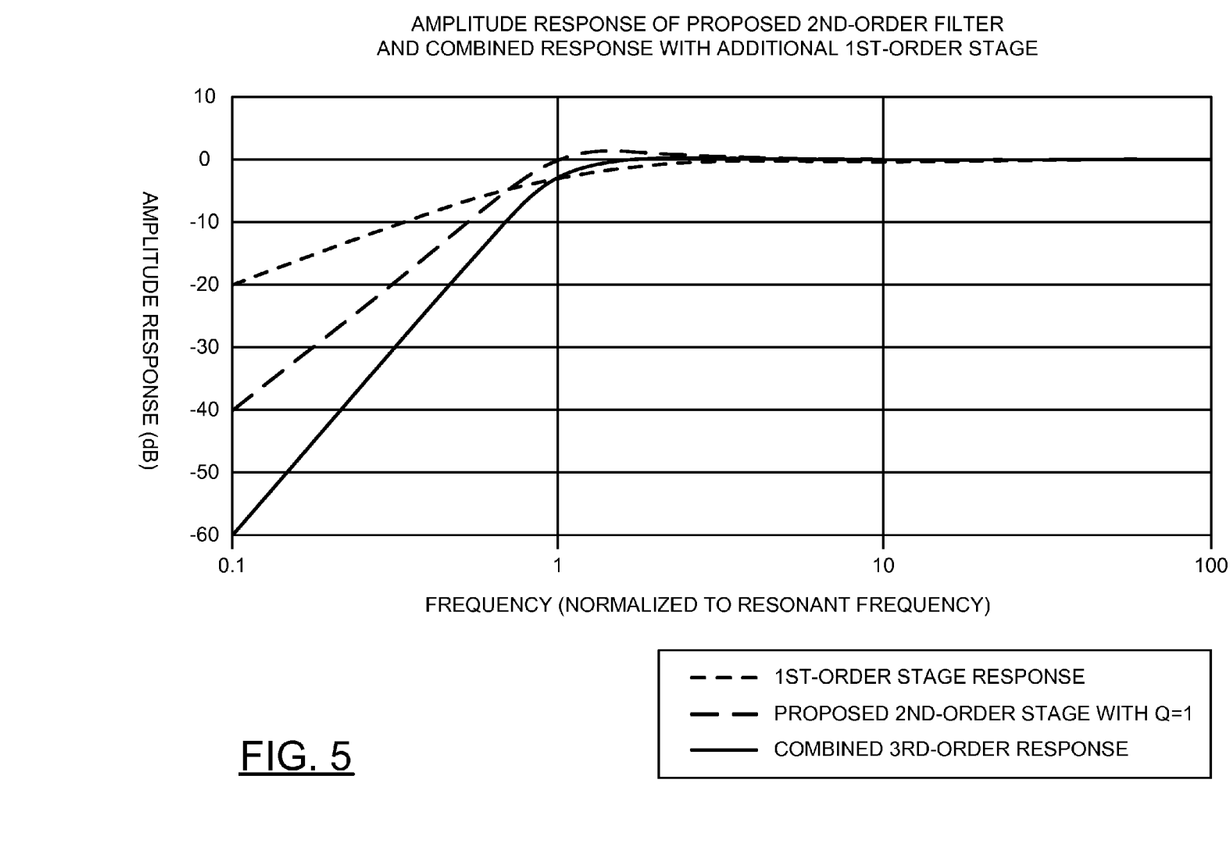
FIG. 5 is a diagram of an amplitude response of the filters of FIG. 4.

Referring to FIG. 5, a plot is shown that illustrates how the circuit 100, used along with the high-pass stage (or circuit) 200, may create a targeted overall transfer function. The circuit 200 may be used to provide additional adjustments to the slope of the output of the circuit 100.

Figure 6:
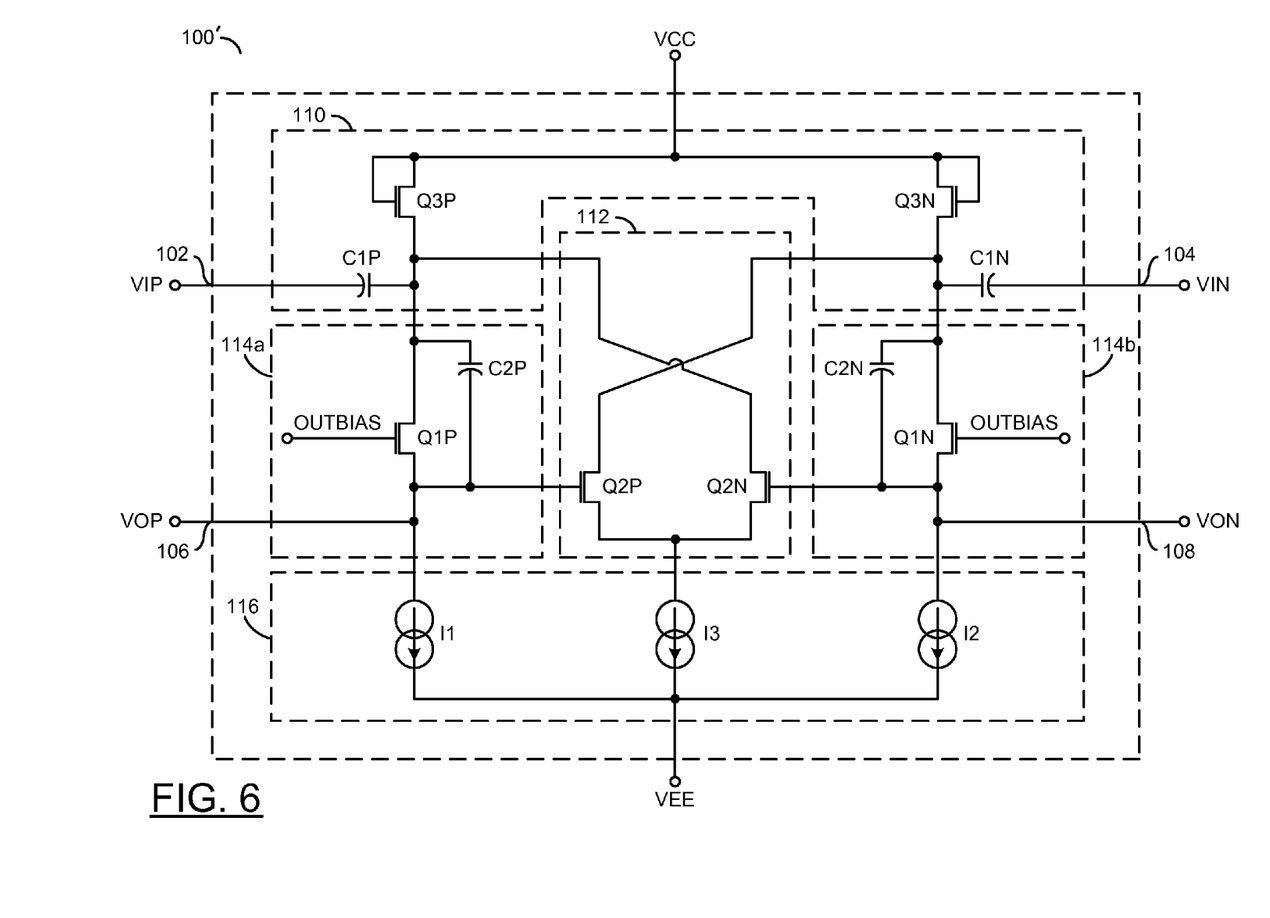
FIG. 6 is a diagram of a MOSFET implementation of the circuit of FIG. 2.

Referring to FIG. 6, a MOSFET implementation of a circuit 100' is shown. The circuit 100' has a similar implementation to the circuit 100. However, the bi-polar NPN transistors have been shown implemented using MOSFET N-channel transistors. The particular polarity of the transistors (e.g., either a P-channel or N-channel) may be varied to meet the design criteria of a particular implementation.

Figure 7:
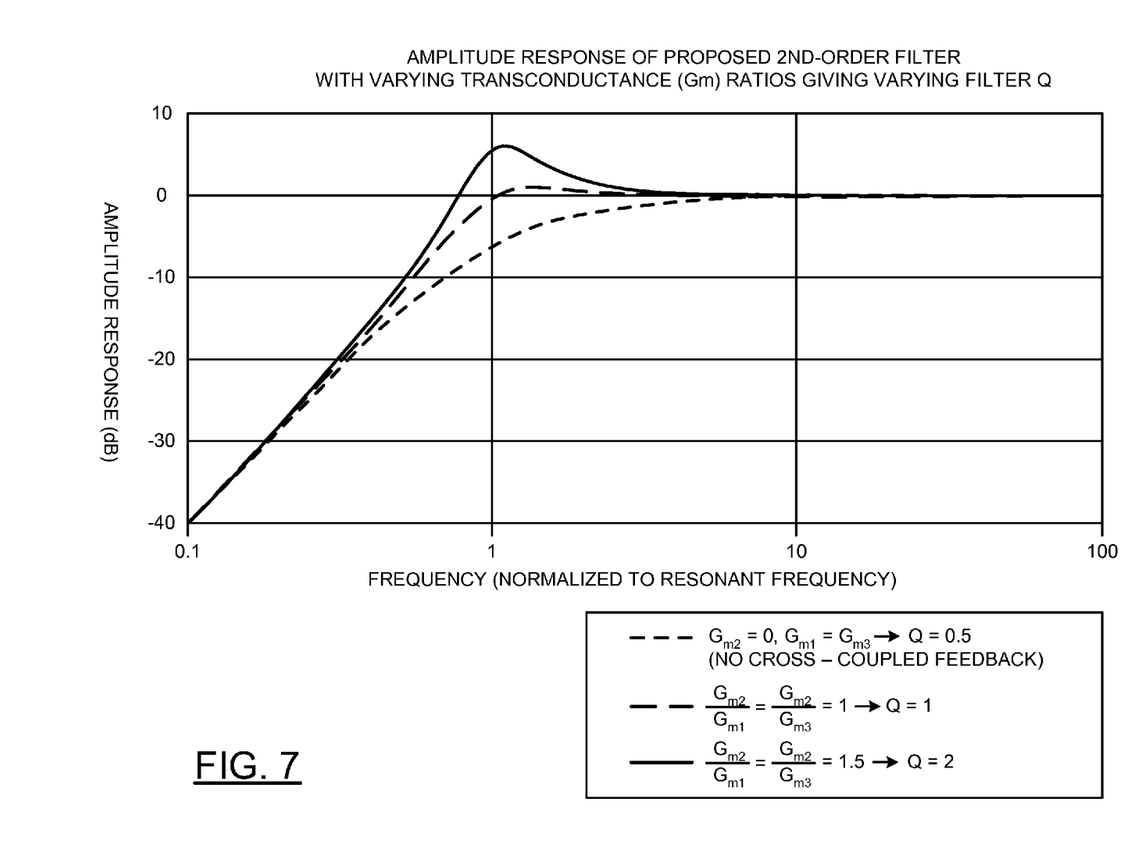
FIG. 7 is a diagram of an amplitude response of the circuit of FIG. 6 with varying values.

Referring to FIG. 7, a diagram of amplitude response is shown. FIG. 7 illustrates examples of amplitude responses that may be obtained from the circuit 100. The frequency response of the circuit 100 may be adjusted to provide a desirable amount of peaking by adjusting Gm2 relative to Gm1 and/or Gm3. When combined with the circuit 200, the overall roll-off may increase relative to FIG. 7.

Figure 8:
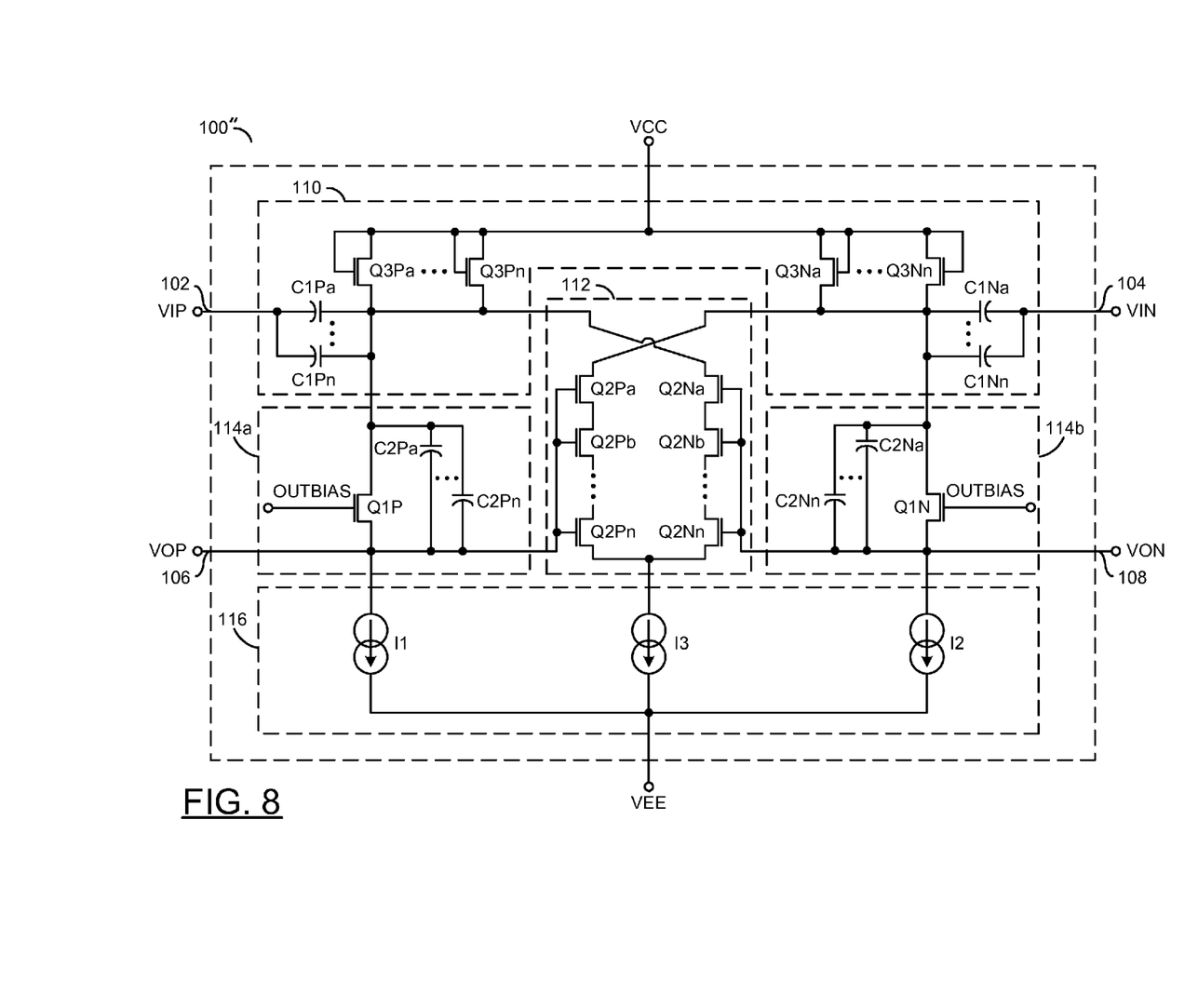
FIG. 8 is a diagram of the circuit of FIG. 6 illustrating an alternate tuning approach.

Referring to FIG. 8, an alternate implementation of a circuit 100" is shown. The circuit 100" is shown implementing the transistors Q2P and/or Q2N as multiple transistors (e.g., Q2Pa-Q2Pn and/or Q2Na-Q2Nn). In such an implementation, the frequency response of the circuit 100" may be varied by enabling any number of the transistors shown. For example, enabling more of the devices Q3Pa-Q3Pn may effectively create a larger device. The frequency response of the circuit 100" may be tuned by varying the transistors Q2P, Q2N, and/or the capacitors C1P, C2P, C1N, and/or C2N. In another example, the frequency response of the circuit 100" may be adjusted by changing the value of the current source I1, I2, and/or I3. In one example, the capacitors C1P, C2P, C1N, and C2N may be implemented as variable capacitors (e.g., varactors).

The transfer function of the circuit 100 may be determined by a resonant frequency (e.g., $\omega_o$) and either Q or a damping ratio. The resonant frequency $\omega_o$ is normally considered the frequency where half of the phase shift through the filter 100 has occurred. In general, the resonant frequency $\omega_o$ may be the frequency where the transition from the stop-band to the pass-band occurs. For a high-pass filter, frequencies above the resonant frequency $\omega_o$ point pass through, while frequencies below the resonant frequency w, are filtered out.

The value Q may be defined as the gain of the circuit 100 at the resonant frequency $\omega_o$. The value Q may be used as an indirect measure of the peaking in the circuit 100. In general, a higher value of Q means more peaking.

The transfer function of the circuit 100 may be defined by the following equation EQ1:

$$\frac{V_o}{V_i} = \frac{s^2}{s^2 + s\left(\frac{G_{m1}}{C_2} + \frac{G_{m3}}{C_1} - \frac{G_{m2}}{C_1}\right) + \frac{G_{m1}G_{m3}}{C_1 C_2}} \qquad \text{EQ1}$$

The resonant frequency (in radians/sec) may be defined by the following equation EQ2:

$$\omega_o = \sqrt{\frac{G_{m1}G_{m3}}{C_1 C_2}} \qquad \text{EQ2}$$

The value Q of the filter 100 may be defined by the following equation EQ3:

$$Q = \frac{\sqrt{\frac{G_{m1}G_{m3}}{C_1 C_2}}}{\frac{G_{m1}}{C_2} + \frac{G_{m3}}{C_1} - \frac{G_{m2}}{C_1}} \qquad \text{EQ3}$$

By selectively assigning the parameters $G_M$ and/or C, the resonant frequency $\omega_o$ and the value Q of the circuit 100 may be tuned. For example, if all $G_m$ terms are set equal, and both C terms are set equal, then $\omega_o = G_m/C$ and Q=1.

Also, as shown in the equation EQ3, the inclusion of feedback (e.g., the $G_{m2}$ term) generally increases the Q of the circuit 100. Without the feedback, the circuit 100 cannot normally achieve a Q greater than 0.5.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more integrated circuits, one or more chips or die arranged as flip-chip modules and/or multi-chip modules or by interconnecting an appropriate network of conventional component circuits, as is described herein, modifications of which will be readily apparent to those skilled in the art(s).

While the invention has been particularly shown and described with reference to the preferred embodiments thereof, it will be understood by those skilled in the art that various changes in form and details may be made without departing from the scope of the invention.

The invention claimed is:

1. An apparatus comprising:
   an input circuit configured to generate a first portion of an intermediate signal in response to an input signal;
   a cross coupled active circuit configured to generate a second portion of said intermediate signal in response to a feedback of an output signal; and
   an output circuit configured to generate said output signal in response to said intermediate signal, wherein (A) said output signal includes frequencies above a target frequency and (B) said apparatus implements a second order high-pass filter.

2. The apparatus according to claim 1, wherein said input signal comprises a differential input signal and said output signal comprises a differential output signal.

3. The apparatus according to claim 1, wherein said apparatus is implemented as one or more integrated circuits.

4. The apparatus according to claim 1, wherein said target frequency is set by adjusting a value Gm of a first transistor and a second transistor included in said output circuit.

5. The apparatus according to claim 4, wherein said target frequency is set by adjusting a value Gm of third and fourth transistors within said input circuit.

6. The apparatus according to claim 1, wherein said cross coupled active circuit comprises a first cross coupled transistor and a second cross coupled transistor.

7. The apparatus according to claim 1, wherein said apparatus further comprises:
   an adjustment circuit configured to set said target frequency.

8. The apparatus according to claim 7, wherein said adjustment circuit comprises a first current source, a second current source and a third current source each connected to a DC voltage.

9. The apparatus according to claim 8, wherein said target frequency is set by changing values of said first current source, said second current source and said third current source.

10. The apparatus according to claim 1, wherein said apparatus implements an active second order high-pass filter.

11. The apparatus according to claim 1, wherein said apparatus generates a roll-off of nearly 40 dB/dec.

12. The apparatus according to claim 1, wherein said second order high-pass filter comprises an active filter that provides Q enhancement.

13. A method for implementing a high pass filter, comprising the steps of:
   (A) generating a first portion of an intermediate signal in response to an input signal;
   (B) generating a second portion of said intermediate signal in response to a feedback of an output signal; and
   (C) generating said output signal in response to said intermediate signal, wherein (A) said output signal includes frequencies above a target frequency and (B) said target frequency is set by changing values of a first current source, a second current source and a third current source.

14. The method according to claim 13, wherein said input signal comprises a differential input signal and said output signal comprises a differential output signal.

15. The method according to claim 13, wherein said target frequency is set by adjusting a value Gm.

16. The method according to claim 13, wherein said method generates a roll-off of nearly 40 dB/dec.

* * * * *